(12) United States Patent
Forshey et al.

(10) Patent No.: US 7,007,822 B2
(45) Date of Patent: Mar. 7, 2006

(54) CHEMICAL MIX AND DELIVERY SYSTEMS AND METHODS THEREOF

(75) Inventors: Randy Forshey, Discovery Bay, CA (US); Kenneth A. Johnson, Stockton, CA (US)

(73) Assignee: The BOC Group, Inc., Murray Hill, NJ (US)

( * ) Notice: Subject to any disclaimer, the term of this patent is extended or adjusted under 35 U.S.C. 154(b) by 255 days.

(21) Appl. No.: 10/436,349

(22) Filed: May 12, 2003

(65) Prior Publication Data

US 2003/0192920 A1 Oct. 16, 2003

Related U.S. Application Data

(60) Continuation of application No. 10/141,644, filed on May 6, 2002, now abandoned, which is a continuation-in-part of application No. 09/968,566, filed on Sep. 29, 2001, now Pat. No. 6,675,987, which is a continuation of application No. 09/870,227, filed on May 30, 2001, now Pat. No. 6,340,098, which is a continuation of application No. 09/568,926, filed on May 11, 2000, now Pat. No. 6,269,975, which is a division of application No. 09/224,607, filed on Dec. 31, 1998, now Pat. No. 6,098,843, which is a continuation of application No. 09/222,003, filed on Dec. 30, 1998, now abandoned.

(51) Int. Cl.
*B67D 5/08* (2006.01)
(52) U.S. Cl. .................... 222/53; 222/53; 222/56; 222/129; 222/145.5; 222/145.6
(58) Field of Classification Search ............ 222/1, 222/53, 56, 58, 145.1, 145.5, 145.6, 129; 137/403, 408
See application file for complete search history.

(56) References Cited

U.S. PATENT DOCUMENTS

| | | | |
|---|---|---|---|
| 3,051,192 A | 8/1962 | Fagot et al. | |
| 3,237,816 A | 3/1966 | Anderson | |
| 3,252,618 A | 5/1966 | Anderson et al. | |
| 3,340,925 A | 9/1967 | Woodburn, Jr. | |
| 3,369,717 A | 2/1968 | Campbell | |
| 3,412,899 A | 11/1968 | Sutter | |
| 3,642,451 A | 2/1972 | Feja et al. | |
| 3,692,048 A | 9/1972 | Uchida et al. | |
| 3,904,078 A | 9/1975 | Nett et al. | |
| 3,930,258 A * | 12/1975 | Dick et al. ............ | 347/7 |
| 3,998,365 A | 12/1976 | Lethen et al. | |
| 4,132,242 A | 1/1979 | Carroll, Jr. | |
| 4,346,818 A | 8/1982 | Bösmiller | |

(Continued)

FOREIGN PATENT DOCUMENTS

EP 1 375 066 A2 1/2004

(Continued)

*Primary Examiner*—Kenneth Bomberg

(57) ABSTRACT

The present invention relates to chemical delivery systems and methods for delivery of liquid chemicals. In one embodiment, the present invention relates to systems having multi-reservoir load cell assemblies for delivering chemicals used in the semiconductor industry. In one embodiment, the present invention provides a multi-reservoir load cell assembly, including a controller, a buffer reservoir, a main reservoir, one or more load cells, coupled to the assembly and to the controller, operable to weigh the liquid in the reservoir (s), a plurality of supply lines, each supply line having a valve and connecting one of the supply containers to the main reservoir, and a gas and vacuum sources for withdrawing the liquid from the assembly when demanded by the controller and for refilling the assembly from the supply containers.

11 Claims, 13 Drawing Sheets

U.S. PATENT DOCUMENTS

| | | | |
|---|---|---|---|
| 4,445,670 A | 5/1984 | Hayashi | |
| 4,488,837 A | 12/1984 | Mizokawa et al. | |
| 4,524,801 A | 6/1985 | Magnasco et al. | |
| RE32,101 E | 4/1986 | Ricciardi et al. | |
| 4,601,409 A | 7/1986 | Diregolo | |
| 4,730,755 A | 3/1988 | Hayashi | |
| 4,830,508 A * | 5/1989 | Higuchi et al. | 366/141 |
| 5,086,435 A | 2/1992 | Studenberg | |
| 5,293,893 A | 3/1994 | O'Dougherty | |
| 5,316,181 A | 5/1994 | Burch | |
| 5,357,306 A | 10/1994 | Skye et al. | |
| 5,383,574 A | 1/1995 | Raphael | |
| 5,478,435 A | 12/1995 | Murphy et al. | |
| 5,479,959 A | 1/1996 | Stotelmyer et al. | |
| 5,490,611 A * | 2/1996 | Bernosky et al. | 222/1 |
| 5,490,809 A | 2/1996 | Jones et al. | |
| 5,558,435 A | 9/1996 | Marjo | |
| 5,584,416 A | 12/1996 | Florian | |
| 5,632,411 A | 5/1997 | Harty et al. | |
| 5,636,762 A * | 6/1997 | Juhola et al. | 222/1 |
| 5,700,401 A | 12/1997 | Weinberg et al. | |
| 5,713,486 A | 2/1998 | Beech | |
| 5,713,492 A | 2/1998 | DeGennaro | |
| 5,750,440 A | 5/1998 | Vanell et al. | |
| 5,753,868 A | 5/1998 | Diem | |
| 5,788,119 A | 8/1998 | Esclar et al. | |
| 5,826,748 A | 10/1998 | Qian et al. | |
| 5,857,893 A | 1/1999 | Olsen et al. | |
| 6,061,608 A | 5/2000 | Moldavsky | |
| 6,098,843 A * | 8/2000 | Soberanis et al. | 222/53 |
| 6,173,864 B1 | 1/2001 | Reighard et al. | |
| 6,257,965 B1 | 7/2001 | Kamikubo et al. | |
| 6,264,064 B1 | 7/2001 | Birtcher et al. | |
| 6,269,975 B1 * | 8/2001 | Soberanis et al. | 222/1 |
| 6,340,098 B1 * | 1/2002 | Soberanis et al. | 222/56 |
| 6,399,902 B1 | 6/2002 | Brownfield et al. | |
| 6,457,852 B1 | 10/2002 | Hiraoka et al. | |
| 6,523,721 B1 | 2/2003 | Nomoto et al. | |
| 6,561,381 B1 | 5/2003 | Osterheld et al. | |
| 6,675,987 B1 * | 1/2004 | Soberunie et al. | 222/53 |
| 6,709,313 B1 | 3/2004 | Kondo et al. | |
| 6,834,777 B1 | 12/2004 | Osterheld et al. | |
| 2002/0186613 A1 | 12/2002 | Hiraoka et al. | |
| 2003/0010792 A1 * | 1/2003 | Forshey et al. | 222/56 |
| 2003/0089456 A1 | 5/2003 | Kim et al. | |
| 2003/0100247 A1 | 5/2003 | Kim et al. | |
| 2003/0189060 A1 | 10/2003 | Osterheld et al. | |
| 2003/0192920 A1 * | 10/2003 | Forshey et al. | 222/504 |
| 2003/0236057 A1 | 12/2003 | Fujita | |
| 2004/0155057 A1 * | 8/2004 | Soberanis et al. | 222/56 |

FOREIGN PATENT DOCUMENTS

| | | |
|---|---|---|
| GB | 1 287 435 | 8/1972 |
| JP | 2002-154057 | 5/2002 |
| JP | 3382138 | 12/2002 |
| JP | 2003-071705 | 3/2003 |
| JP | 3432161 | 5/2003 |
| JP | 2003/165050 | 6/2003 |
| JP | 2003-188123 | 7/2003 |
| JP | 2003-197576 | 7/2003 |
| JP | 2003-197577 | 7/2003 |
| JP | 2003-282499 | 10/2003 |
| JP | 2004-022940 | 1/2004 |
| JP | 2004-039968 | 2/2004 |
| JP | 2004-063850 | 2/2004 |
| JP | 3538042 | 3/2004 |
| JP | 2004-98286 | 4/2004 |

* cited by examiner

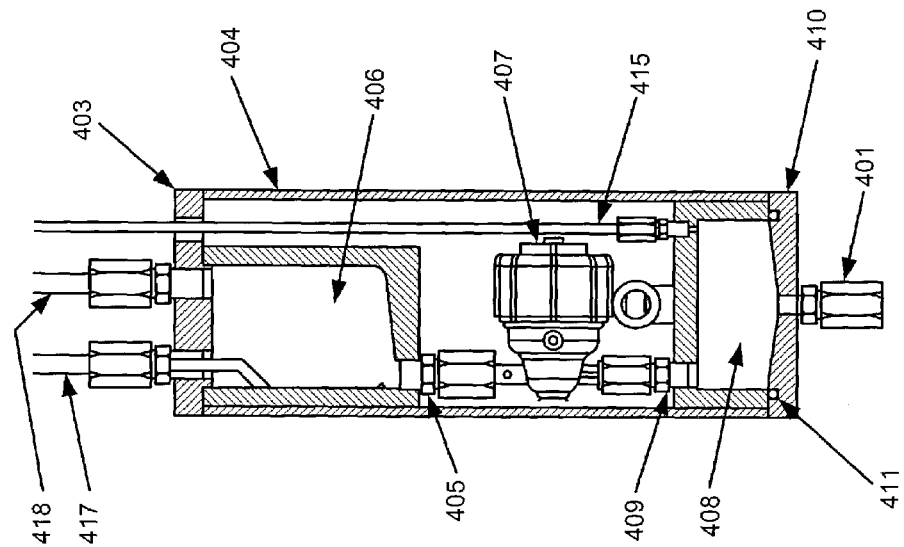
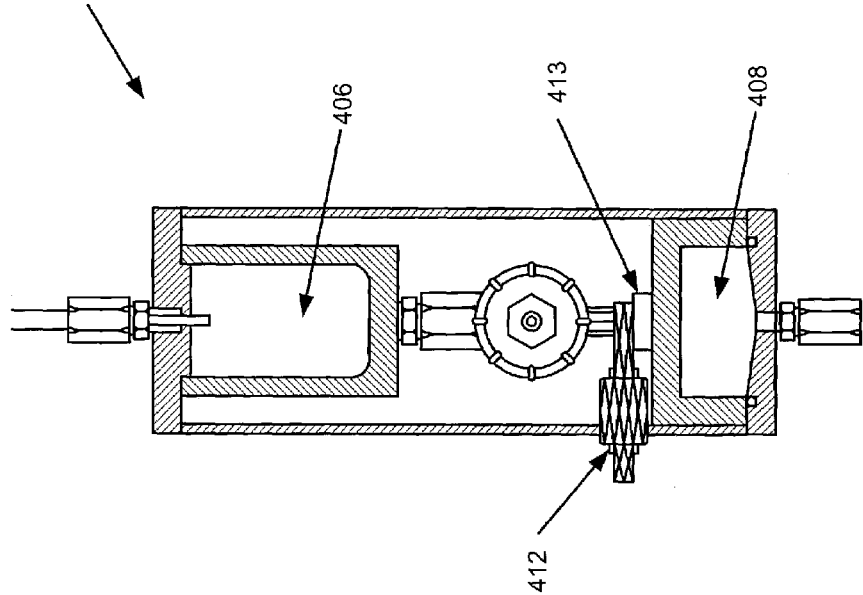
Figure 4A
Figure 4B

CHEMICAL MIX AND DELIVERY SYSTEMS AND METHODS THEREOF

BACKGROUND

This application is a continuation of U.S. application Ser. No. 10/141,644, filed on May 6, 2002, now abandoned which is a continuation-in-part of U.S. application Ser. No. 09/968,566, filed on Sep. 29, 2001, now U.S. Pat. No. 6,675,987 which is a continuation of U.S. application Ser. No. 09/870,227, filed on May 30, 2001, now U.S. Pat. No. 6,340,098, which is a continuation of U.S. application Ser. No. 09/568,926, filed on May 11, 2000, now U.S. Pat. No. 6,269,975, which is a divisional of U.S. application Ser. No. 09/224,607, filed on Dec. 31, 1998, now U.S. Pat. No. 6,098,843, which is a continuation of U.S. application Ser. No. 09/222,003, filed on Dec. 30, 1998, now abandoned. This application incorporates by reference each application and each patent listed above.

The present invention relates generally to systems and methods for mixing and/or delivering of liquid chemical(s), and more particularly, to systems and methods for mixing and delivering liquid chemicals in precise amounts using logic devices and multi-reservoir load cell assemblies.

The present invention has many applications, but may be explained by considering the problem of how to deliver photoresist to silicon wafers for exposure of the photoresist in the process of photolithography. To form the precise images required, the photoresist must be delivered in precise amounts on demand, be free of bubbles, and be of precise uniform thickness on the usable part of the wafer. The conventional systems have problems as discussed below.

As shown in FIG. 1, a representative conventional photoresist delivery system includes supply containers 100, 102, typically bottles, which supply photoresist to a single-reservoir 104 by line 117, which is connected to supply lines 106, 108 monitored by bubble sensors 110,112 and controlled by valves V1 and V2. The bottom of the reservoir is connected to a photoresist output line 114 to a track tool (not shown), which dispenses photoresist on the wafer. The space above the photoresist in the reservoir 104 is connected to a gas line 118 which, based on position of a three-way valve V3, either supplies nitrogen gas to the reservoir 104 from a nitrogen manifold line 126, regulated by needle valve 1, or produces a vacuum in the reservoir 104. To sense the level of the photoresist in the reservoir 104, the system employs an array of capacitive sensors 122 arranged vertically on the walls of the reservoir 104. A two-way valve V4, located between the nitrogen gas manifold and the inlet of a vacuum ejector 124, supplies or cuts off flow of nitrogen to the vacuum ejector 124.

The photoresist delivery system must be "on-line" at all times so the track tool can dispense the photoresist as required. Many of the photoresist delivery systems attempt to use the reservoir to provide an on-line supply of photoresist to the track tool, but the photoresist delivery system must still refill the reservoir on a regular basis, which is dependent on timely replacement of empty supply containers. Otherwise, the track tool will still fail to deliver the photoresist when demanded.

During dispense mode, when the track tool withdraws photoresist from the reservoir 104, the valve V3 permits the nitrogen to flow from the nitrogen manifold to the reservoir 104 to produce a nitrogen blanket over the photoresist to reduce contamination and to prevent a vacuum from forming as the photoresist level drops in the reservoir. Once the photoresist in the reservoir 104 reaches a sufficiently low level the system controller (not shown) initiates refill mode, where a set of problems arise.

During refill mode, the valve V4 is activated so that nitrogen flows from the manifold line 126 to the vacuum ejector 124, which produces a low pressure line 170 thereby producing a low pressure space above the photoresist in the reservoir 104. The bubble sensors 110,112 monitor for bubbles in the supply lines 106,108, presumed to develop when the supply containers 100, 102, become empty. If, for example, the bubble sensor 110 detects a bubble, the controller turns off the valve V1 to supply container 100 and the valve V2 opens to supply container 102 to continue refilling the reservoir 104. However, bubbles in the supply line 106 may not mean supply container 100 is empty. Thus, not all of the photoresist in supply container 100 may be used before the system switches to the supply container 102 for photoresist. Thus, although the conventional system is intended to allow multiple supply containers to replenish the reservoir when needed, the system may indicate that a supply container is empty and needs to be replaced before necessary.

If the supply container 100 becomes empty and the operator fails to replace it and the system continues to operate until the supply container 102 also becomes empty, the reservoir 104 will reach a critical low level condition. If this continues, bubbles may be arise due to photoresist's high susceptibility to bubbles; if a bubble, however minute, enters the photoresist delivered to the wafer, an imperfect image may be formed in the photolithography process.

Further, if the pump of the track tool, connected downstream of the chemical output line 114, turns on when the reservoir is refilling, the pump will experience negative pressure from the vacuum in the single-reservoir pulling against the pump. Several things can happen if this persists: the lack of photoresist delivered to the track tool may send a false signal that the supply containers are empty, the pump can fail to deliver photoresist to its own internal chambers, lose its prime and ability to adequately dispense photoresist, and the pump can even overheat and burn out. The result of each scenario will be the track tool receives insufficient or even no photoresist, known as a "missed shot," which impacts the yield of the track tool.

The present invention also may be explained by considering the problems associated with mixing and delivering slurry for chemical mechanical polishing (CMP). In semiconductor manufacturing, a slurry distribution system (SDS) delivers CMP slurry to the polisher. For example, *Handbook of Semiconductor Manufacturing Technology* (2000), which is incorporated by reference, describes delivery of CMP slurries to a polisher and shows an arrangement for a SDS at page 431. In some applications, the SDS needs to mix the components of the slurry in a mix tank. During mixing and handling of the slurry, the SDS must not damage the slurry by subjecting it to too much shear, which may cause aggregation, or too little shear, which may cause settling. A pump may transfer the slurry to a distribution tank when required by the process tool. The SDS should handle a variety of chemistries because a CMP slurry formulation is often tailored to each process. The SDS should introduce precise of amounts of the slurry components into a mix tank so that the slurry mixture is known. At times, there also needs to be a precise flow rate to the process tool and/or delivery at low flow rates. At low flow rates sometime microbubbles form in the dispense lines, which prevents slurry delivery. It would be desirable to clear lines without shut down of the SDS. Of course, reliability for flawlessly daily manufacturing and delivery of the slurry is also desired, as well as ease of regular maintenance to avoid varying slurry composition that may affect process results.

Flow meters are commonly used to control the flow rates of chemicals. Flow meters are usually only accurate to within 2–3% of the desired flow rate, and are also susceptible to changes due to input pressure. Second, some chemicals will cause the flow meter to plug up and allow no flow, i.e. slurries. Another method for controlling flow is to use a "push" gas to pressurize a reservoir, and then adjust the push gas pressure to adjust the flow rate. This method also will not allow accurate flow rates, due to the potential of the push gas pressure changing, and the flow rate varying as the level within the reservoir changes.

The present invention addresses these problems as well as avoids waste of chemicals, provides a friendly user interface depicting the amount of chemicals remaining in the supply containers, and reduces system capital and operating costs. If, for example, the amount of chemical in the supply containers cannot be seen, the present invention permits the interface to be provided at a distance by conventional computer network capabilities and the electronics provided.

SUMMARY OF THE INVENTION

The present invention relates to systems using controllers or logic devices and multi-reservoir load cell assemblies for precision mixing and/or delivery of liquid chemicals. It also relates to methods of delivering liquid chemicals from supply sources to processes such that the present invention accurately accounts and adjusts for the dynamic supply and use of the liquid chemical to meet process requirements. Finally, the present invention provides multi-reservoir load cell assemblies for monitoring, regulating, and analyzing the liquid supply available to a process.

BRIEF DESCRIPTION OF THE DRAWINGS

FIG. 4A is a front cross-section of a second embodiment of the multi-reservoir load cell assembly.

FIG. 4B is a side cross-section of the second embodiment of the multi-reservoir load cell assembly.

DETAILED DESCRIPTION OF THE PREFERRED EMBODIMENTS

Figure 1:
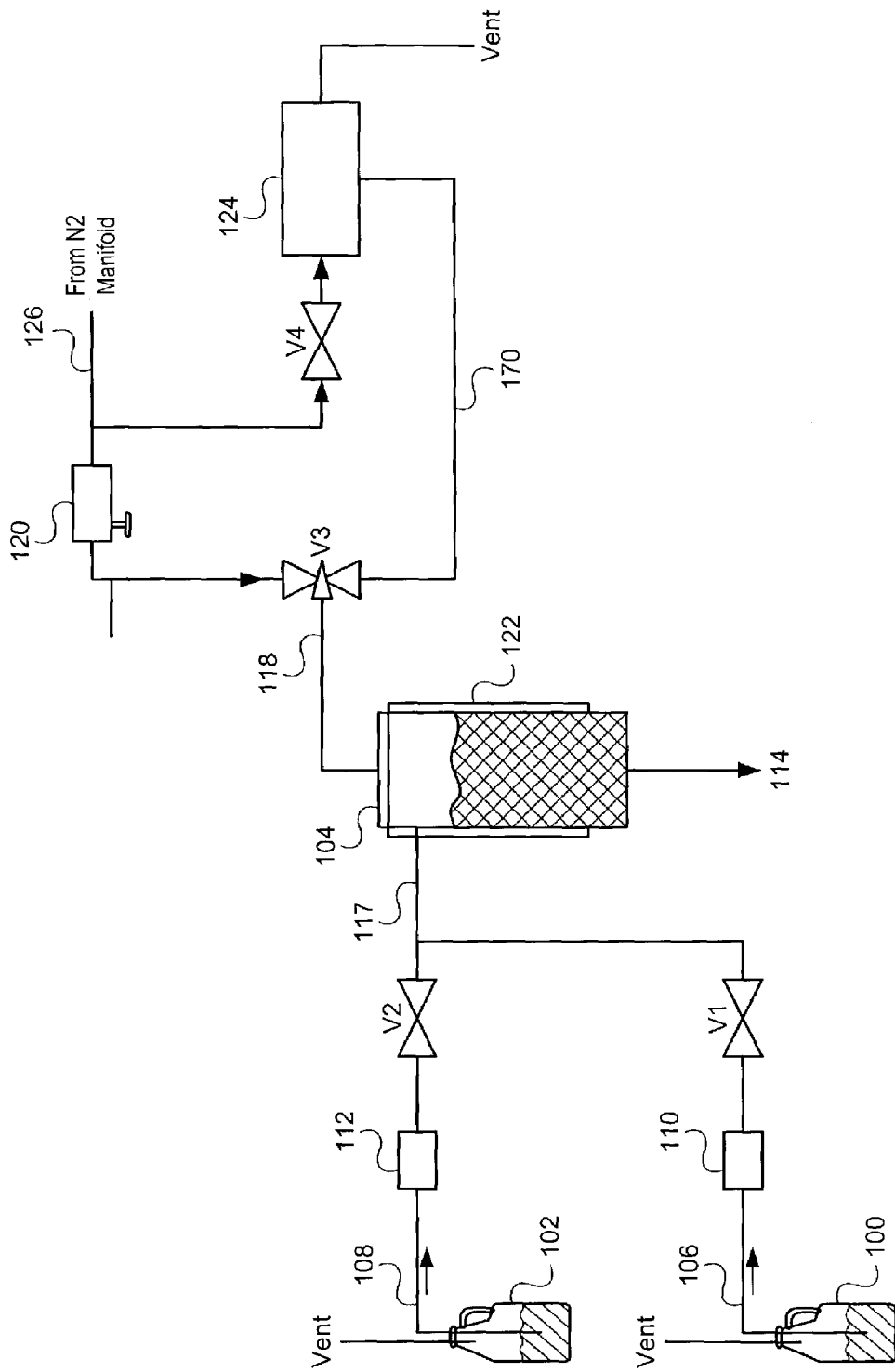
FIG. 1 illustrates a chemical delivery system using a single-reservoir and bubble sensors on the supply lines leading to the single-reservoir.
Figure 2B:
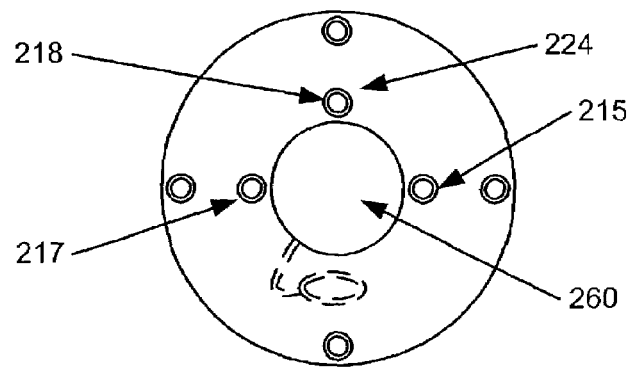
FIG. 2B is a top view of the first embodiment of the multi-reservoir load cell assembly.
Figure 2A:
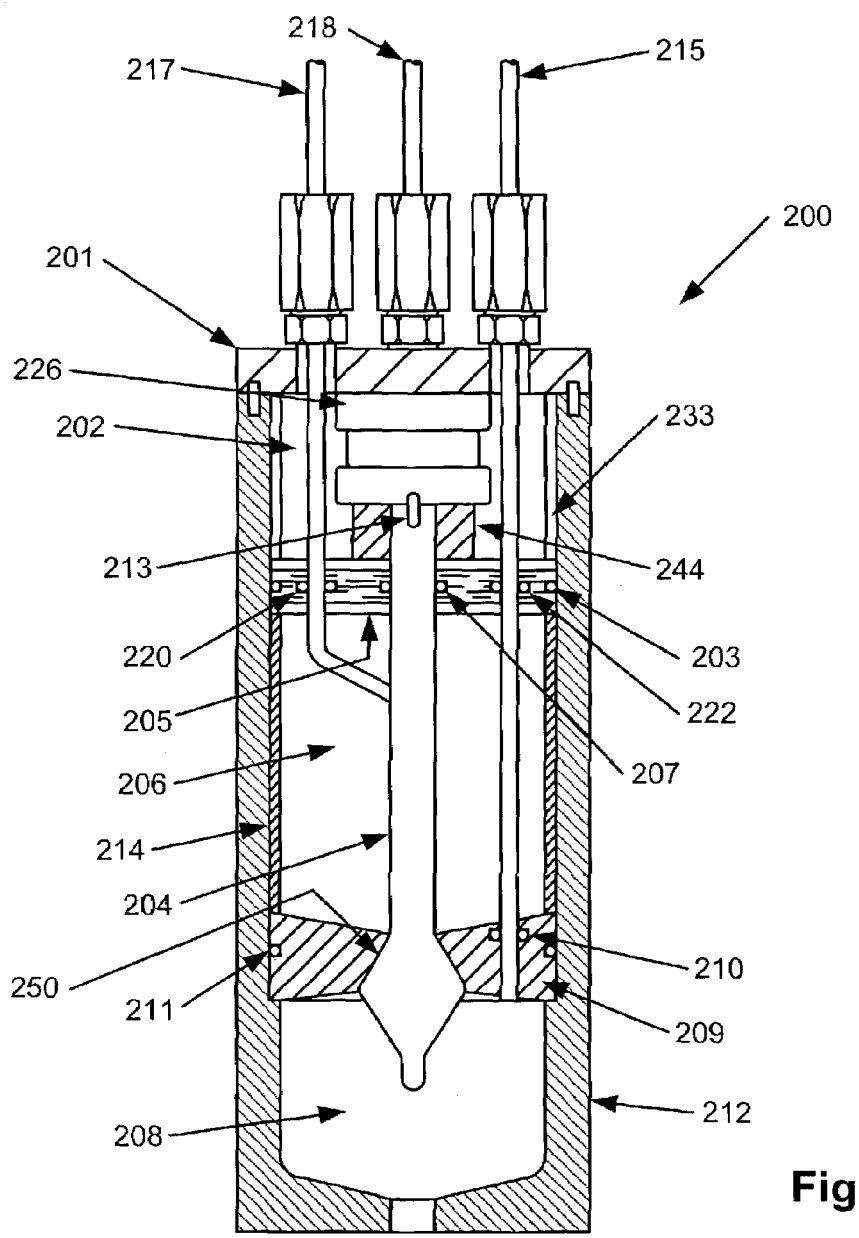
FIG. 2A is a front cross-section of a first embodiment of the multi-reservoir load cell assembly of the present invention.

In the first embodiment, the present invention includes a multi-reservoir load cell assembly 200 as shown in FIGS. 2A–2B. The assembly 200 can be part of the system shown in FIG. 3, and can replace the problematic single-reservoir 104 and bubble sensors 110, 112 of FIG. 1.

In this embodiment, the assembly 200, constructed of Teflon, SST, polypropylene or any chemical compatible material, includes an upper compartment 202, a main reservoir 206, and a buffer reservoir 208, all in an outer housing 212. The buffer reservoir 208 is sealed from the main reservoir 206 by a separator 209, and an o-ring seal 211 seals the perimeter of the separator 209 to the outer housing 212. The separator 209 uses a center conical hole 250 that allows an internal sealing shaft 204 to form a liquid and gas-tight seal with the separator 209. The separator 209 forms a liquid and gas-tight seal to the pneumatic tube 215 with an o-ring seal 210. The main reservoir 206 contains a middle sleeve 214 that forms a rigid separation between the separator 209 and the reservoir cap 205. O-ring 203 seals the perimeter of the reservoir cap 205 seals against the internal surface of the outer housing 212. The reservoir cap 205 seals against the internal sealing shaft 204, the chemical input tube 217, and the pneumatic tubes 215 and 218 with a set of o-ring seals 207, 220, 222, and 224 (hidden, but location shown in FIG. 2B), respectively. Mounted to the reservoir cap 205 is a spacer 244, which also mounts to the pneumatic cylinder 226. The reservoir cap 205 is held in position by the upper sleeve 233 and the middle sleeve 214. The outer Teflon reservoir top 201 is bolted to the outer housing 212 and forms a mechanical hard stop for the upper sleeve 233 and the pneumatic cylinder 226. Pneumatic airlines for the pneumatic cylinder 226 penetrate the outer Teflon reservoir top 201 through the clearance hole 260.

It should be clear that the present invention is not limited to the delivery of CMP slurries or photoresist on silicon wafers. For example, although the invention shows advantages over the conventional system in this environment, the systems of the present invention can deliver other liquid chemicals for other types of processes. Because the novelty of the present invention extends beyond the nature of the chemical being delivered, the following description refers to the delivery of chemicals to avoid a misunderstanding regarding the scope of the invention.

Figure 3:
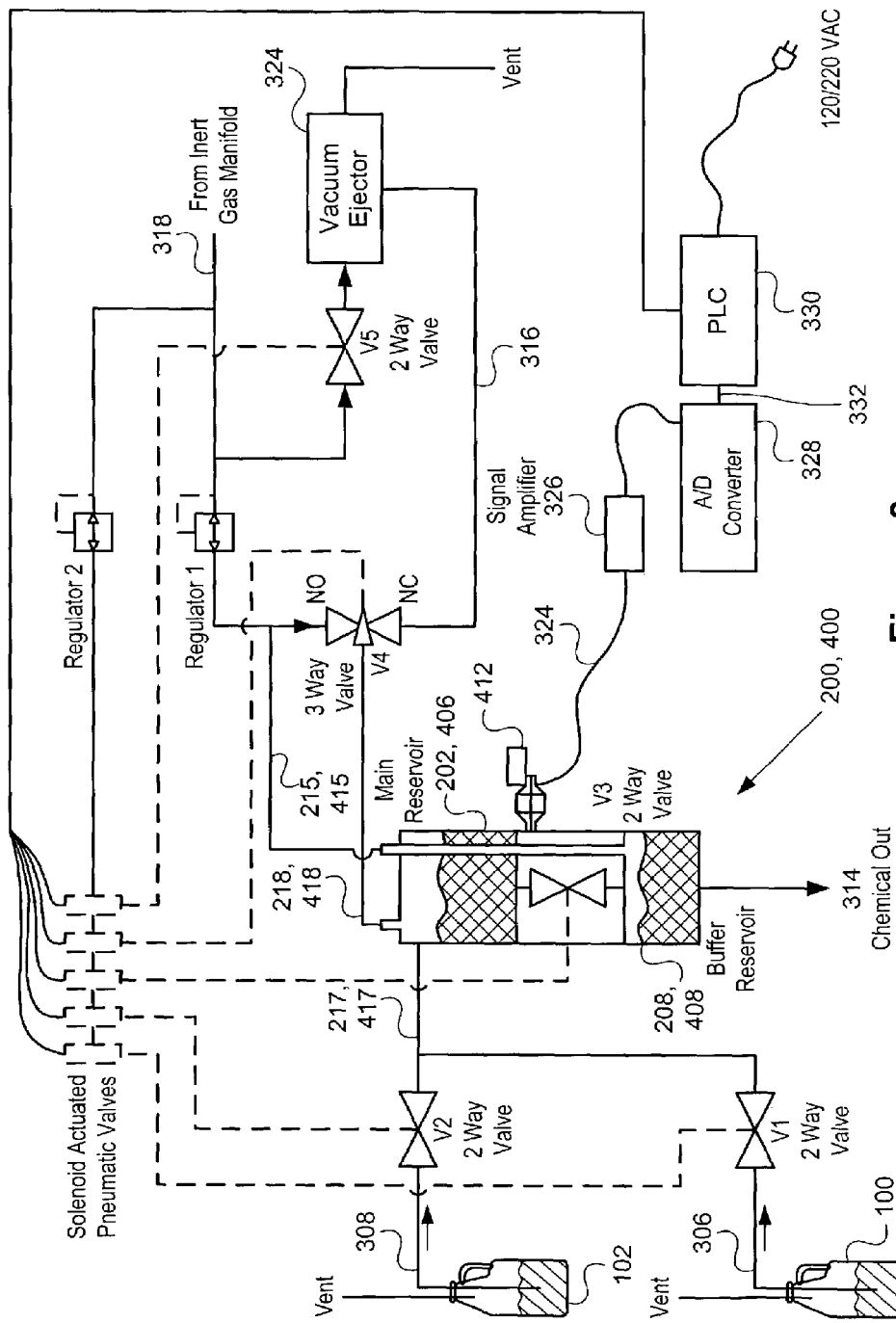
FIG. 3, a piping and instrument diagram, illustrates embodiments of the chemical delivery system including the multi-reservoir load cell assemblies of FIGS. 2A–2B or 4A–4B.

As shown in FIG. 3, the multi-reservoir load cell assembly 200 shown in FIGS. 2A–2B is suspended on and weighed by a load cell 412, preferably such as a Scaime load cell model no. F60X10C610E and a programmable logic controller (PLC) 330, preferably such as the Mitsubishi FX2N, a computer, or another conventional logic device determines the volume of the chemical in the assembly 200 from the load cell weight and the specific gravity of the chemical. For brevity, we will refer to that logic device as a PLC. As chemical from line 217 is drawn into the main reservoir 206, the load cell 412 outputs a small mV analog signal 324 proportional to the weight on the load cell 412. In one embodiment, an ATX-1000 signal amplifier 326 boosts the small signal 324 to the 4–20 millivolt range and sends it to an analog-to-digital converter 328, such as the Mitsubishi FX2N4-AD, and the output digital signal 332 is sent to the PLC 330. The PLC 330 can be rapidly programmed by conventional ladder logic. During withdrawal of the chemical, the weight of the assembly 200 decreases until the software set point of the PLC 330 is reached.

As further shown in FIG. 3, the PLC 330 may control valves V1–V5 using 24 DC Volt solenoid actuated valves, and activate them by an output card such as the Mitsubishi FX2N. Each solenoid valve, when opened, allows pressurized gas from regulator 2 such as a VeriFlow self-relieving regulator, to the pneumatically operated valves V1–V5 to open or close the valves. The sequence of operation of the first embodiment is programmed in the PLC 330 so the components shown in FIGS. 2A–2B and 3 work as described below.

Once the chemical drops to a certain level, the PLC 330 triggers the system shown in FIG. 3 to begin an automatic refill sequence using the multi-reservoir load cell assembly 200 of FIGS. 2A–2B as follows:

a) A blanket of preferably low pressure, e.g., one psi inert gas is continuously supplied by the regulator 1, such as a Veriflow self-relieving regulator, to the main reservoir 206 by the pneumatic tube 218.

b) The pneumatic cylinder 226 lifts the internal sealing shaft 204, thereby sealing the buffer reservoir 208 from the main reservoir 206.

c) Once the buffer reservoir 208 is sealed, the main reservoir 206 is evacuated to a vacuum of approximately 28 inches of mercury. As shown in FIGS. 2A–2B, the pneumatic tube 218 from the main reservoir 206 connects to the output side of a three-way valve V4. Valve V4 is actuated so that the tube 218 communicates with the line 316 connected to the vacuum ejector 324 as shown in FIG. 3. The vacuum ejector 324 is powered by compressed gas, which is directed to it by the two-way valve V5. Once valve V5 is on, it allows compressed gas to pass through and the vacuum ejector 324 develops about 28 inches of mercury (vacuum) through the line 316 communicating with the main reservoir 206.

d) The vacuum is isolated from the buffer reservoir 208, which has an inert gas slight blanket above it and continues to supply chemical to the process or tool without exposing the chemical being delivered to the tool to negative pressure or a difference in pressure.

e) The vacuum generated in the main reservoir 206 creates a low pressure chemical line that is connected to the valves V1 and V2. Assuming that valve V2 opens, the low pressure line 217 causes chemical from the supply container 102 to flow into the main reservoir 206. During this period of time the main reservoir 206 refills with chemical until a determined full level is achieved.

f) The full level is determined by use of the load cell 412 and weight calculations performed by the PLC 330. For example, one preferred embodiment uses a buffer reservoir 208 with a volume capacity of 439 cubic centimeters (cc) and a main reservoir 206 with a capacity of 695 cc. Using the specific gravity of the chemical, the PLC 330 calculates the volume that the chemical occupies. The PLC 330 then begins a refill sequence once the chemical volume reaches or falls below 439 cc. The refill stops once the chemical volume reaches 695 cc. This sequence allows nearly all of the 439 cc of the chemical in the buffer reservoir 208 to be consumed while refilling the main reservoir 206 with the 695 cc of chemical and prevents overflow of the main reservoir 206 or complete evacuation of chemical from the buffer reservoir 208.

g) Once the main reservoir 206 has refilled, the valve V5 is turned off, thereby stopping gas flow to and vacuum generation by the vacuum ejector 324. The three-way valve V4 is then switched so that the inert gas line 218 communicates with the main reservoir 206 and an inert gas blanket is again formed over the chemical in the main reservoir 206 at the same pressure as the buffer reservoir 208, since both lines 218, 215 receive gas from the same inert gas manifold 318 (see FIG. 3). Also, the valve V2 is closed which now isolates the supply container 102 from the main reservoir 206.

After the main reservoir 206 is full of chemical with an inert gas blanket above, the internal sealing shaft 204 is lowered and allows chemical from the main reservoir 206 to flow into the buffer reservoir 208. Eventually, the buffer reservoir 208 completely fills along with a majority of the main reservoir 206. The pneumatic tube 215 connecting the buffer reservoir 208 fills with chemical until the chemical in the tube 215 reaches the same level as the main reservoir 206, because the pressures in both reservoirs are identical. The internal sealing shaft 204 remains open until it is determined, to once again, refill the main reservoir 206.

Because the first embodiment uses load cells instead of bubble sensors for determining the amount of chemical in the supply containers, the present invention provides a number of very useful features. One can accurately determine in real-time the chemical remaining in the supply containers. If the supply containers are full when connected to the system, the PLC can easily calculate the chemical removed (and added to the multi-reservoir load cell assembly) and how much chemical remains in the supply containers. This information can be used to provide a graphical representation of the remaining amount of chemical in the containers. A second feature is that the PLC can determine precisely when a supply container is completely empty by monitoring the weight gain within the system. If the weight of the reservoir does not increase during a refill sequence then the supply container is inferred to be empty. This causes the valve for the supply container to be closed and the next supply container to be brought on line. A related third feature is the load cell technology provides the ability to accurately forecast and identify the trends in chemical usage. Since the exact amount of chemical is measured coming into the reservoir the information can be easily electronically stored and manipulated and transmitted.

A second embodiment of the multi-reservoir load cell assembly 400 shown in FIGS. 4A–4B, includes a buffer reservoir 408, fastened and sealed by the o-rings 411 to the bottom cap 410. The output chemical flows through tube connection 401. Connected to the buffer reservoir 408 are a pneumatic tube 415, a chemical valve 407, a load cell separator 413, and the load cell 412. The load cell 412 is securely bolted to the buffer reservoir 408 and the other side is securely bolted to a rigid member (not shown) not part of the multi-reservoir load cell assembly 400. The outer sleeve 404 slips around the buffer reservoir 408 and rests against the bottom cap 410. The outer sleeve 404 is machined to allow the load cell 412 to pass through it unencumbered. End 405 of the valve 407 connects to the main reservoir 406 and the other end 409 connects to buffer reservoir 408. The main reservoir 406 is encapsulated and sealed, by o-rings in the upper cap 403. The upper cap 403 incorporates a stepped edge along its periphery to secure the outer sleeve 404 to it. Pneumatic line 418 and chemical input line 417 are secured to the upper cap 403. The outer sleeve 404 provides the mechanical strength for the separate reservoirs 406 and 408.

The multi-reservoir load cell assembly shown in FIGS. 4A–4B, and used in the system of FIG. 3, is similar to the first embodiment with the following notable differences:

a) Valve 407 provides control of the fluid path between the main reservoir 406 and the buffer reservoir 408.

b) The outer sleeve 404 provides the mechanical support to form the rigid assembly that supports the main reservoir 406 as well as the buffer reservoir 408.

Figures 5A, 5B:
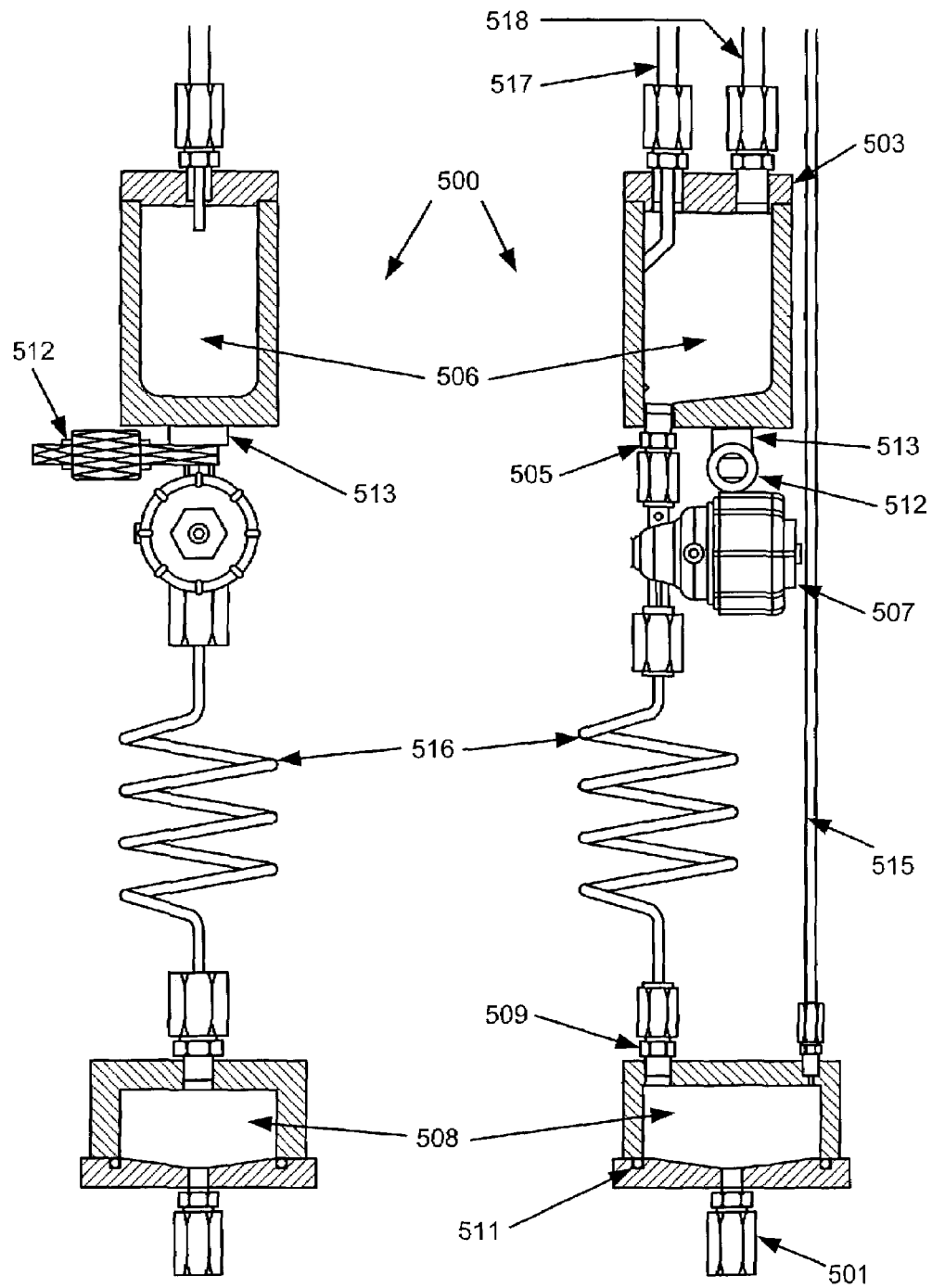
FIG. 5A is a front cross-section of a third and sixth embodiment of the multi-reservoir load cell assembly.
FIG. 5B is a side cross-section of the third and sixth embodiment of the multi-reservoir load cell assembly.

A third embodiment of the multi-reservoir load cell assembly shown in FIGS. 5A–5B, employs two reservoirs 506, 508 spaced apart from each other but connected by a flexible fluid line 516. The third embodiment uses many of the previous components shown in FIGS. 4A–4B, except: (i) it does not use an outer sleeve 404; (ii) the buffer reservoir 508 is not mechanically suspended from the main reservoir 506; and (iii) the load cell spacer 513 and the load cell 512 are fastened to the bottom of the main reservoir 506.

Figure 6:
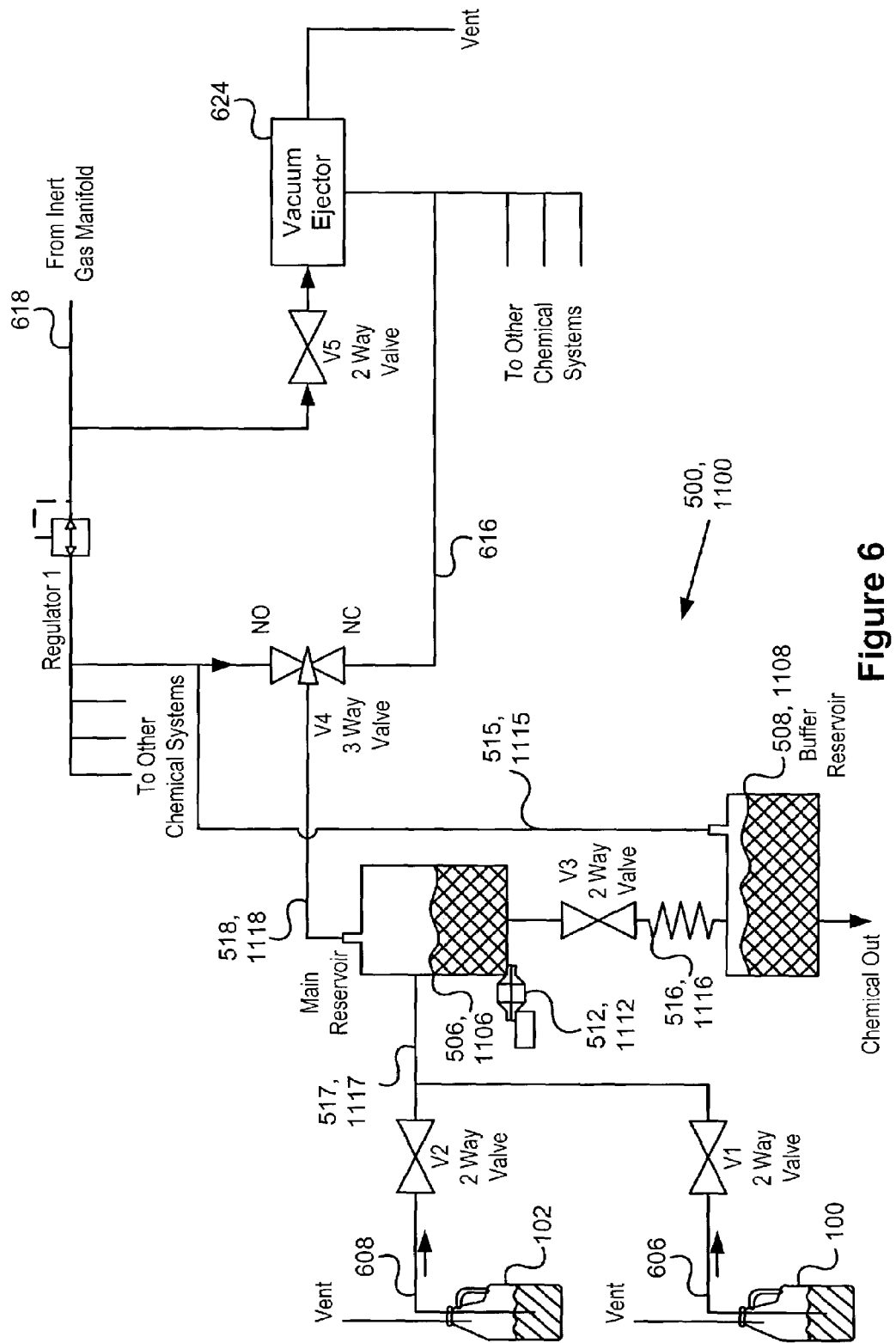
FIG. 6, a piping and instrument diagram, illustrates embodiments of the chemical delivery system including the multi-reservoir load cell assemblies of FIGS. 5A–5B or 11A–11B.

The third embodiment operates like the second embodiment except the load cell 512 only measures the volume of chemical in the main reservoir tank 506 as shown in FIGS. 5A–5B and 6. The advantage of the third embodiment is the precise amount of chemical brought into the main reservoir 506 is always known and the PLC does not have to infer the amount of chemical that was removed from the buffer reservoir 508 during a refill operation. The third embodiment can be used in the system of FIG. 6 with the control system (i.e., PLC, A/D, signal amplifier, etc.) of FIG. 3. Note, in the application, the lead digit of the part numbers generally indicates which drawing shows the details of the part, while the trailing digits indicate that the part is like other parts with the same trailing digits. Thus, the buffer reservoir 206 and the buffer reservoir 306 are similar in function, and found in FIG. 2A and FIG. 3A, respectively.

Figures 7A, 7B:
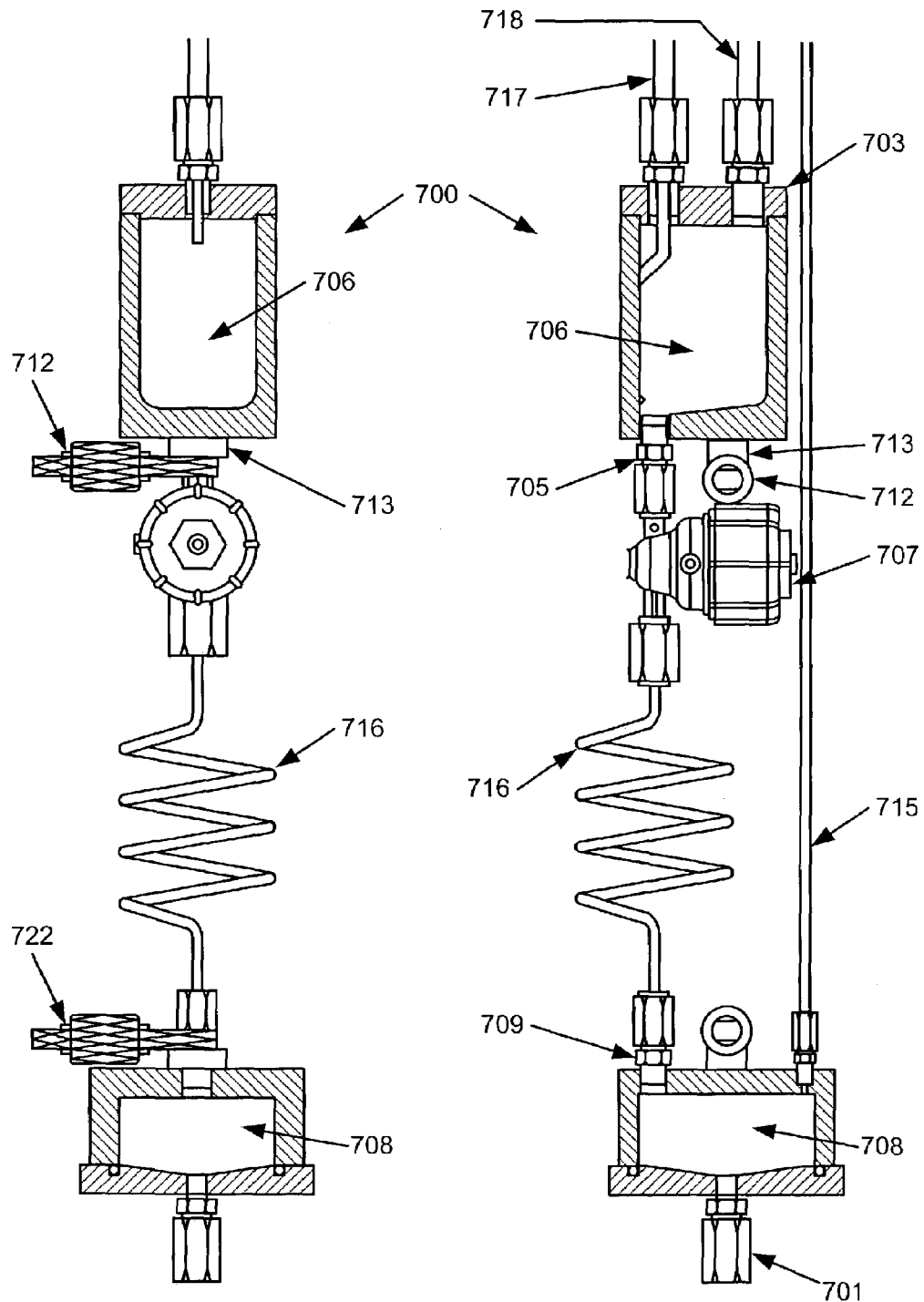
FIG. 7A is a front cross-section of a fourth embodiment of the multi-reservoir load cell assembly.
FIG. 7B is a side cross-section of the fourth embodiment of the multi-reservoir load cell assembly.
Figure 8:
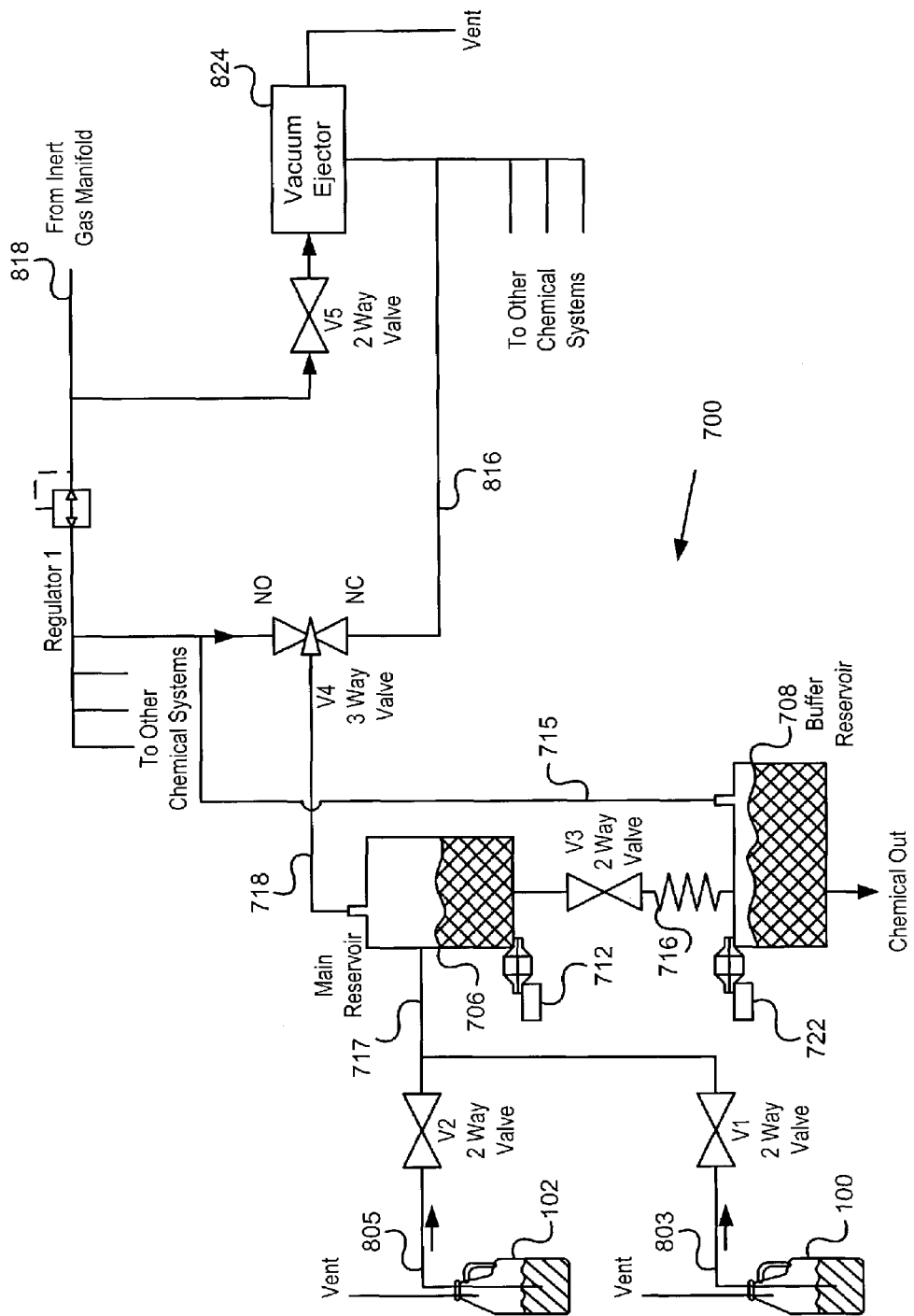
FIG. 8, a piping and instrument diagram, illustrates an embodiment of the chemical delivery system including the multi-reservoir load cell assembly of FIGS. 7A–7B.

A fourth embodiment of the multi-reservoir load cell assembly 700 shown in FIGS. 7A–7B, employs the same components as the third embodiment, however, a second load cell 722 is attached to the buffer reservoir 708. The assembly 700 is preferably used with the system of FIG. 8 with the control system of FIG. 3 with additional components for the second load cell.

The fourth embodiment of the multi-reservoir load cell assembly 700 shown in FIGS. 7A–7B, operates much like the second embodiment except that the load cell 712 only measures the chemical in the main reservoir 706 and the load cell 722 only measures the chemical in the buffer reservoir 708. The advantage here is the buffer reservoir 708 is constantly monitored so if the downstream process or tool suddenly consumes large amounts of chemical during a refill cycle, the system can stop the refill cycle short to bring chemical into the buffer reservoir 708 from the main reservoir 706 to prevent the complete evacuation of chemical from the buffer reservoir 708.

Figures 9A, 9B:
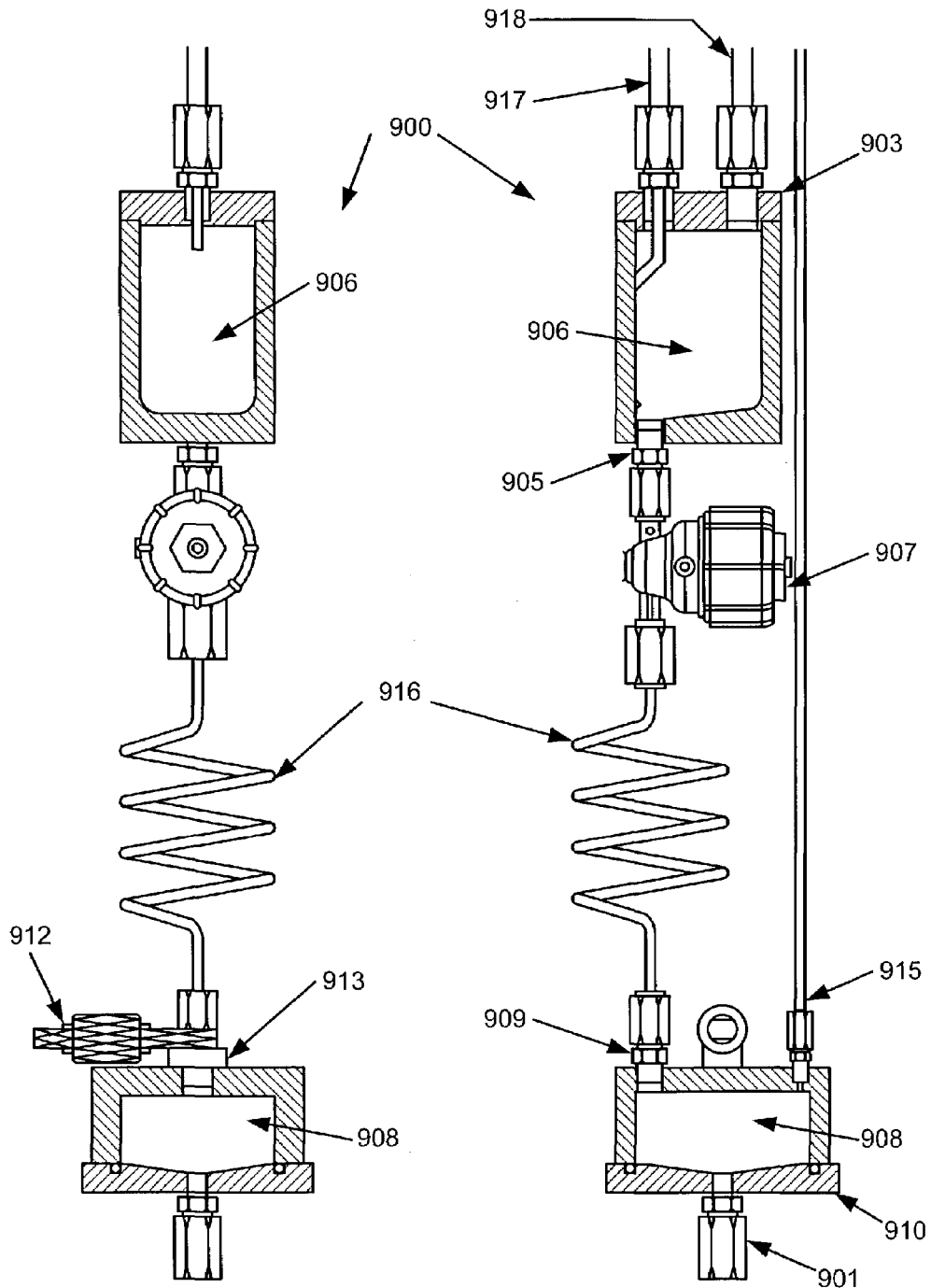
FIG. 9A is a front cross-section of a fifth embodiment of the multi-reservoir load cell assembly.
FIG. 9B is a side cross-section of the fifth embodiment of the multi-reservoir load cell assembly.
Figure 10:
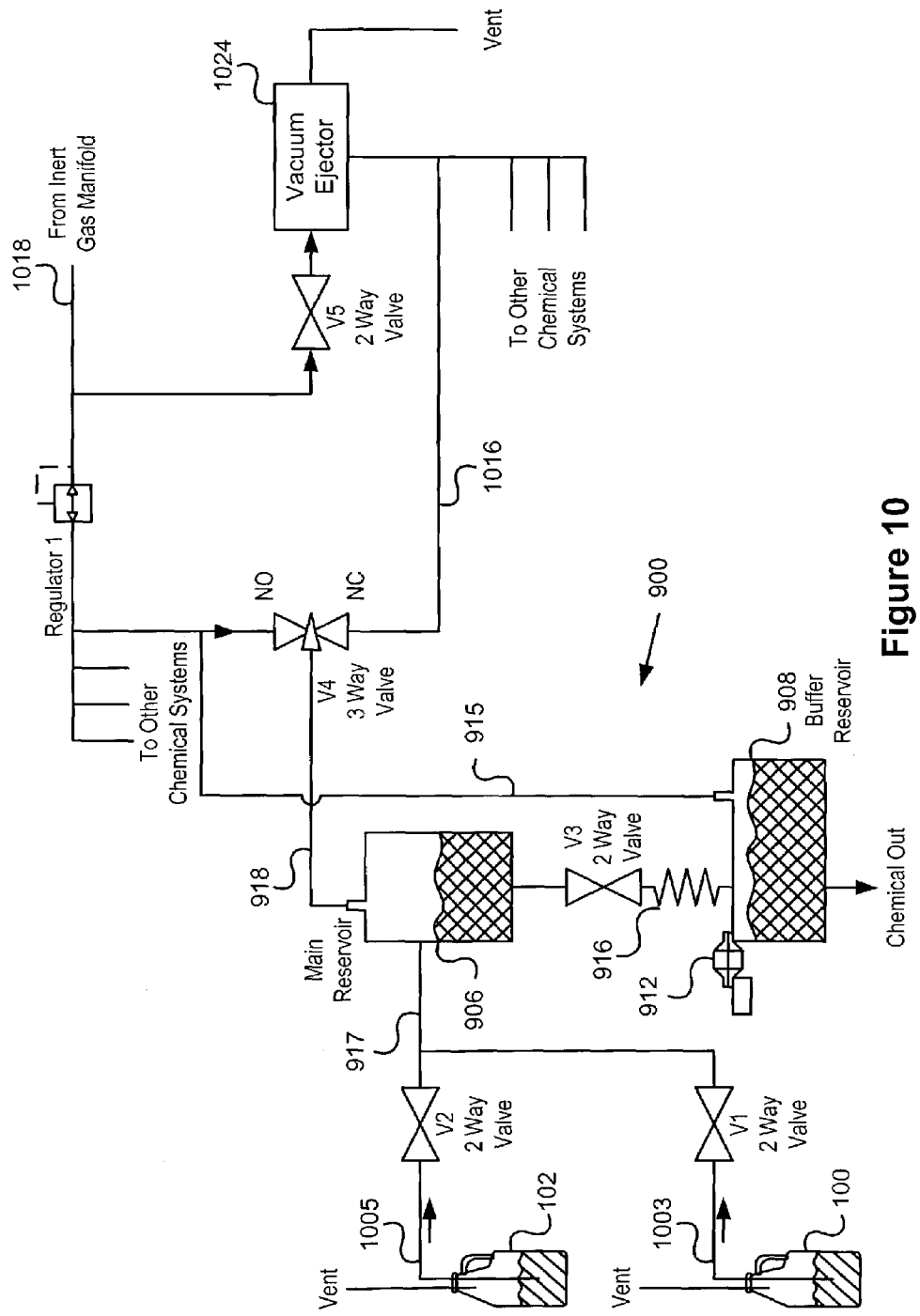
FIG. 10, a piping and instrument diagram, illustrates an embodiment of the chemical delivery system including the multi-reservoir load cell assembly of FIGS. 9A–9B.

A fifth embodiment of the multi-reservoir load cell assembly 900 shown in FIGS. 9A–9B uses the same components as the third embodiment, except the load cell 912 is attached to the buffer reservoir 908 instead of the main reservoir 906. The fifth embodiment is preferably used in the system depicted in FIG. 10 with the control system (i.e., PLC, A/D, signal amplifier, etc.) shown in FIG. 3.

Functionally, the fifth embodiment of the multi-reservoir load cell assembly 900 operates the same as the second embodiment, the only difference is the load cell 912 only weighs the chemical in the buffer reservoir 908.

As the process or tool consumes the chemical, the weight of the buffer reservoir 908 remains constant until the main reservoir 906 also becomes empty. Then the weight in the buffer reservoir 908 will start to decrease, indicating that the main reservoir 906 needs to be refilled. At this point the main reservoir 906 is refilled for a calculated period of time. During this sequence the buffer reservoir 908 decreases until the main reservoir 906 has been refilled and the valve 907 has been reopened between the two reservoirs 906, 908.

A sixth embodiment uses the same components of third embodiment shown in FIGS. 5A–5B. The only notable difference is that the inert gas blanket (see FIG. 6) of approximately one psi is increased to approximately 80 psi (more or less depending on the type of chemical). The increased inert gas pressure enables the sixth embodiment to use pressure to dispense the chemical at a constant output pressure, which remains unaffected even during the refill cycle. This method would allow very precise non-pulsed output flow of the chemical. This may be a highly critical feature in an ultra high purity application that pumps the chemical through a filter bank. Any pulsation of the chemical can cause particles to be dislodged from the filter bank into the ultra-pure chemical output flow.

Figures 11A, 11B:
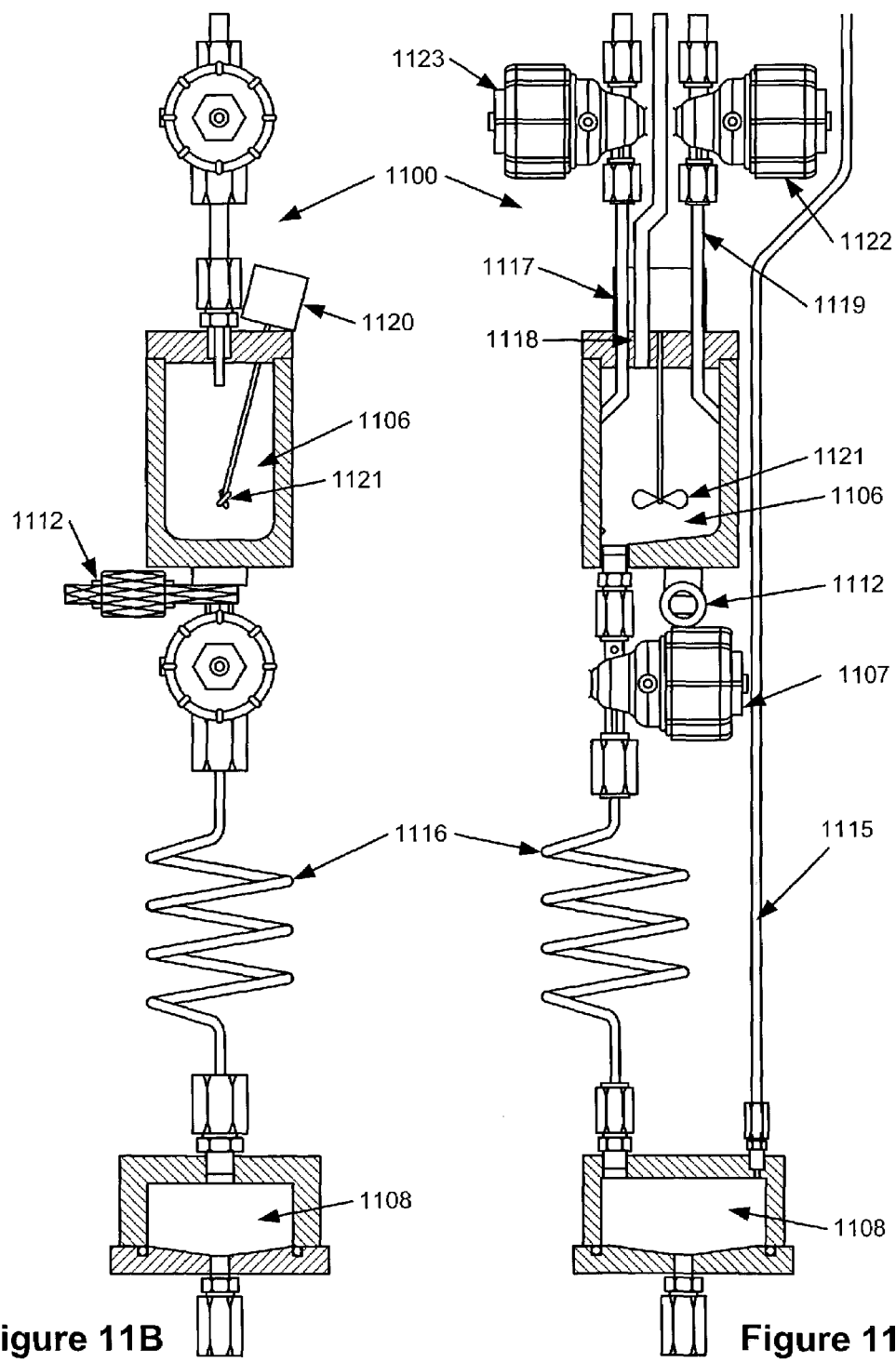
FIG. 11A is a front cross-section of a seventh embodiment of the multi-reservoir load cell assembly.
FIG. 11B is a side cross-section of the seventh embodiment of the multi-reservoir load cell assembly.

A seventh embodiment uses the same components as the third embodiment with additional components shown in FIGS. 11A–11B, including a main reservoir 1106, a buffer reservoir 1108, a second chemical input line 1119 added to the main reservoir 1106 through the valve 1122, a valve 1123 added to the chemical input line 1117, and a stir motor 1120 and an impeller assembly 1121.

Functionally, the seventh embodiment operates the same as the third embodiment with the added capability of mixing two chemicals in precise proportions before transferring the mixture to the buffer reservoir 1108. The chemical can be drawn into the main reservoir 1106 through open valve 1123 and the chemical input line 1117 and weighed by the load cell 1112. When the proper amount has been drawn into the main reservoir 1106, the valve 1123 is closed and the valve 1122 is opened to allow the second chemical to enter the main reservoir 1106. When the proper amount has been drawn into the main reservoir 1106, the valve 1122 is closed and the chemicals are blended via the stir motor 1120 and impeller assembly 1121. The stirring of the chemicals can be initiated at any time during the above sequence. Once the mixing is complete, the valve 1107 opens to allow the chemical to transfer to the buffer reservoir 1108, which is also connected to gas line 1115. This is an ideal way to mix time sensitive chemistries and maintain a constant, non-pulsed output of the blended chemicals.

Figure 12:
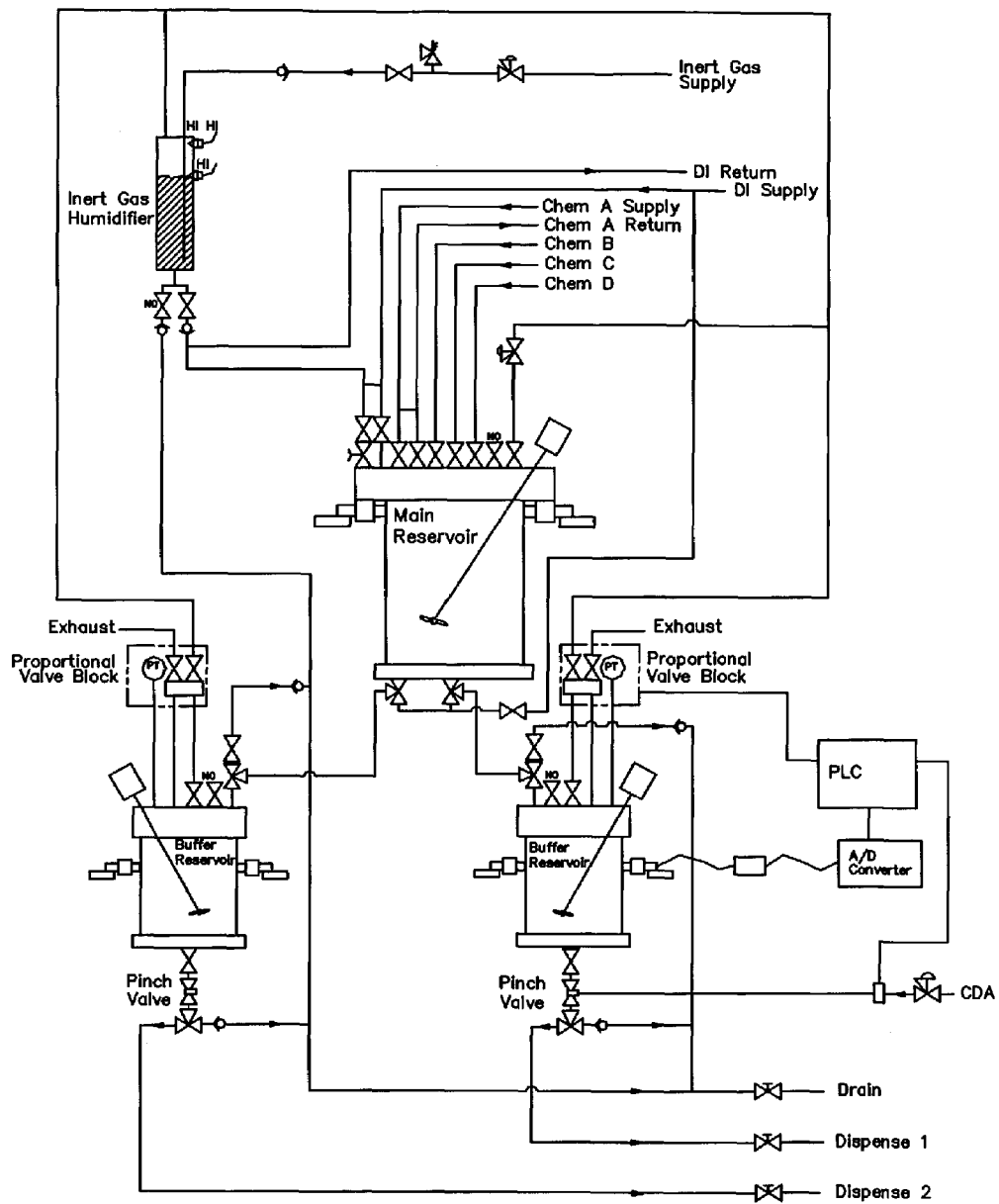
FIG. 12, a piping and instrument diagram, illustrates an embodiment of the chemical mix and delivery system.

FIG. 12, a piping and instrument diagram, illustrates an embodiment of a chemical mixing and delivery system. For clarity we will discuss how the system can be used to mix components together into CMP slurry, but the system can be used to mix other chemicals. FIG. 12 contains many parts, so to avoid clutter we use double-digit part numbers rather than four-digit as the leading and trailing digit convention would require as discussed at page 13.

The system includes a main reservoir 69 with DI water lines supplying DI water through a gross fill valve 41 and a flow control valve 43, and a fine fill valve 42. In an embodiment, the gross fill valve is a ⅜-inch valve, and the fine fill valve is a ¼-inch valve. As discussed in connection with FIG. 3, the PLC may control valves using 24 DC Volt solenoid actuated valves, and activate them by an output card such as the Mitsubishi FX2N. Each solenoid valve, when opened, allows pressurized gas from regulator such as a VeriFlow self-relieving regulator, to the pneumatically operated to open or close the valves. These actuators will be referred to in the specification, but will not be shown in FIG. 12 to reduce clutter.

In an embodiment, the PLC sends a signal to such an actuator to open the gross fill valve 41 permitting water to rapidly begin to fill the main reservoir 69. When the main reservoir 69 contains almost sufficient water, the PLC provides another signal to an actuator to close the gross fill valve 41 and to intermittently open and close the fine fill valve 42, so called "chatter" the valve. This permits the system to add the precise balance of DI water required for the mixture. Of course, this gross fill and fine fill arrangement can be used for any component but is most useful if there is a major amount of that component in the final mixture. The flow control valve 43 is a manual or automatic controlled valve that compensates for the different water pressures available at a given facility.

The DI water recirculates through a bypass 40 then back to the DI return. If the velocity of the water recirculating is kept above some level such as seven feet/sec, it will reduce or eliminate bacteria formation. The purpose of the DI water is to dilute Chem A, which represents slurry. The slurry passes through a fine fill valve 44 to the main reservoir 69, through a bypass 53 and recirculates to the Chem A return, which reduces the settling of abrasives suspended in the Chem A.

Chemicals B–D represent other components used in small amounts such as stabilizers, surfactants, and pad conditioners supplied through fine fill valves 46–48 into the main reservoir 69. The PLC sends control signals to admit Chem A through Chem D sequentially so that the load cells 12 and 13 of the main reservoir 69 can weigh each component accurately. The two load cells shown in FIG. 12 may permit higher accuracy than one load cell, but the number of load cells is not essential to the invention. The PLC also sends control signals to the engage the main mixer motor 20, which rotates the shaft 24 and impeller 21, which stirs the components into CMP slurry. Process requirements will define the best time period and rpm for the impeller 21. The impeller 21 will continuously stir certain CMP slurry formulations.

As shown at the top of FIG. 12, an inert gas supply provides inert gas through a regulator, a safety pressure relief valve 33, and a check valve 35 to an inert gas humidifier. For some CMP slurries nitrogen is preferred, but other chemicals require other gases. One of ordinary skill will know what inert gas is suitable for a given CMP formulation. For brevity we will discuss the inert gas as being nitrogen, which is bubbled through a tube in the DI water to humidify the nitrogen. This reduces the caking of the CMP slurry mixture inside the main and buffer reservoirs. The humidified nitrogen is supplied through the main reservoir pressure regulator 51, an inlet pressure valve 50, and to the main reservoir 69. The vent valve 49 is a safety valve, which is normally open (NO) when not actuated. As known, the set of check valves 16, 35, 37, 39, 76, 86, and 99 prevent backflow on the associated lines.

The main reservoir 69 transfers the mixed CMP slurry to buffer reservoir(s). In one embodiment, the main reservoir 69 holds two liters so that it can effectively service each of two buffer reservoirs 71, 92, holding one liter each. The transfer of the CMP slurry passes through a main reservoir outlet valve 58, through a line, then to a buffer reservoir inlet valve 60. Likewise, the main reservoir 69 transfers the CMP slurry initially through a main reservoir outlet valve 57, through a line, then to a buffer reservoir inlet valve 97. The process tool determines when the buffer reservoirs 71 and 92 deliver the CMP slurry through dispense lines 1 and 2. Manual valves 84 and 85 are associated with the dispense lines 1 and 2 lines for safety.

Buffer reservoirs 71 and 92 each include a proportional valve block, which will be used by the PLC to control the pressure in each buffer reservoir. The PLC sends control signals to the proportional valve block to maintain the pressure in the buffer reservoirs that is necessary to achieve a desired flow rate of CMP slurry from the buffer reservoirs. For example, the pressure transducer, PT in FIG. 12, reads the pressure in the buffer reservoir 71 and sends a signal indicative of that pressure to the PLC. Based on the measured pressure and the pressure set point, the PLC will send signals to the proportional valve block to either open a buffer control inlet valve 80 to increase the buffer reservoir pressure 71 or open a buffer control outlet valve 81 to decrease the buffer reservoir pressure 71. Likewise, the pressure transducer of buffer reservoir 92 reads the pressure and sends signals to the proportional valve block to maintain the pressure necessary for a desired flow rate of CMP slurry from the buffer reservoir 92. Based on the PLC signals, the proportional valve block will either open a buffer control inlet valve 56 to increase or open buffer control outlet valve 52 to decrease the pressure of the buffer reservoir 92. The buffer reservoir 92 also includes an optional buffer manifold 90, which can be used as a mounting surface to connect multiple buffer outlet valves, but is not required for a single buffer outlet valve 87 as illustrated. The buffer reservoir 71 is shown with a buffer manifold 72, which is also not required for a single buffer outlet valve 73.

A pinch valve is located downstream of the buffer outlet valve 73, and another downstream of buffer outlet valve 87. FIG. 12 shows one suitable control arrangement for the pinch valve of buffer reservoir 71, which can be used for other buffer reservoirs such as the buffer reservoir 92. In this arrangement, the PLC connects to an air actuator 78, which controls the flow rate of clean dry air (CDA) passing through a pressure regulator 79. Although not depicted in FIG. 12, it should be evident that the same communication channels, clean dry air source, and CDA lines can be used as one embodiment for the control of the pinch valve of the buffer reservoir 92. The signal amplifier 77, the A/D converter, and the load cells shown in FIG. 12 can be the same parts and have the same operation described in the earlier embodiments. The mixer motor 93 rotates shaft 94 and impeller 95 in the buffer reservoir 92, and the mixer motor 71 rotates shaft 65 and impeller 66 in the buffer reservoir 71. The buffer reservoirs 71 and 92 include buffer reservoir vent valves 62 and 53, which are normally open to release pressure when not in service as safety features.

The parts described can be obtained from the following vendors. Partek, A Division of Parker Corporation located in Tucson, Ariz. can provide suitable gross fill valves, part no. PV36346-01, fine fill valves, part no. PV106324-00, valve manifolds 70, 72, and 90, part no. CASY1449, and check valves part number CV1666. Another suitable PLC is the Mitsubishi AG05-SEU3M. A suitable proportional valve block is part no. PA237 manufactured and/or sold by Proportion Aire, Inc. located in McCordsville, Ind. A suitable inert gas humidifier part no. 43002SR01, and pinch valve, part no. PV-SL-.25, are manufactured and/or sold by Asahi America located in Malden, Mass.

In operation, the chemical mix and delivery system has different modes. The initial mode is a fill or refill sequence where the system adds and mixes together the components in the main reservoir 69. In one embodiment, the fill or refill sequence can be implemented as follows:

1. The PLC sends control signals to open the DI line and Chem A–D lines to supply components to the main reservoir 69. Although not the only arrangement, it is preferred to admit these chemical components sequentially to the main reservoir 69 so that the load cells 12 and 13 directly indicate the weight of each component in the final mixture.

2. The PLC sends control signals to an actuator to shut off the inlet pressure valve 50 which would otherwise admit nitrogen to the main reservoir 69 and to open the normally open vent valve 49 so any residual gases can vent from the main reservoir 69.

3. The PLC sends control signals to start the mixer motor 20. In one embodiment, the mixer motor 20 starts when the impeller 21 is covered with DI water or Chem A, but the time is process dependent and not part of the invention. It could start before, during, or after the time Chem A-D and DI water enter the main reservoir 69.

4. The PLC sends control signals to an actuator to open the inlet pressure valve 50 to increase the nitrogen pressure to a sufficient pressure, e.g., 20 psig, determined by the flow rate and process requirements.

The PLC or logic device(s) will also send control signals to prepare the inert gas humidifier for service as follows:

1. The PLC sends control signals to an actuator to close the DI drain valve 36, which is normally open, of the inert gas humidifier.

2. The PLC sends control signals to open the DI inlet valve 38 so that DI water begins to fill the inert gas humidifier.

3. The HI sensor associated with the inert gas humidifier will subsequently detect a high DI water level and send signals to the PLC to send control signals to close the DI inlet valve 38. Separately, the HI HI sensor functions to send an alarm signal if the DI water fills beyond the operational level.

4. The PLC sends control signals to an actuator to open the valve 34, which admits nitrogen to bubble up through the DI water to humidify the nitrogen that flows from the inert gas humidifier. The valve 34 is either all the way open or all the way closed. It is normally closed (NC) so that when the system is powered down, that is, out of operation, valve 34 closes preventing introduction of the inert gas, e.g., nitrogen into the inert gas humidifier.

5. The inert gas humidifier feeds the nitrogen through the lines up to the inlet pressure valve 50 and the buffer inlet control valves 56 and 80. It should be noted that the pressure supplied through the inlet pressure valve 50 is used to pressure the CMP slurry out of the main reservoir 69 at the desired flow rate.

The system transfers the CMP slurry mixed from the main reservoir to the buffer reservoir as follows:

1. The PLC sends a signal to open main reservoir dispense valve 58 and to open buffer reservoir inlet valve 60.

2. The PLC also sends signals to control the proportional valve block to maintain the desired pressure in the buffer reservoir(s), that is, the set point stored in the PLC. In one embodiment, the set point pressure may be 5–12 psig when the pressure of the main reservoir 69 is held at 20 psig. In one example, a pressure transducer labeled PT in FIG. 12 provides the pressure in the buffer reservoir 71 and the buffer control outlet valve 81 opens if the pressure is too high or the buffer control inlet valve 80 opens if the pressure is too low compared to the set point for buffer reservoir 71.

3. The mixer motor 93 or 64 of the buffer reservoir 92 or 71 stirs the components into a mixture. Again, the start time and time period and rpm depend on the process.

In one embodiment, the process tool, for example, polisher, triggers when the dispense valve outlet 87 and 73 of respectively the buffer reservoir 92 and 71 open and close.

The load cells 91 and 96 of the buffer reservoir 92 send signals to the PLC, which will be used to control the main reservoir outlet valve 57 and the buffer inlet valve 97 for transfer of CMP slurry between the main reservoir 69 and the buffer reservoir 92. The buffer reservoir 71 operates by a similar arrangement as shown in FIG. 12.

The load cells 12 and 13 associated with the main reservoir 69 will indicate when to add new components to make another batch of CMP slurry. The main reservoir dispense valves 57 and 58 are closed when the components are added to the main reservoir 69 so that the load cells 12 and 13 accurately indicate the weight of each component added to the main reservoir 69.

To clean and/or flush out the main reservoir 69, the PLC can send control signals to close the main reservoir dispense valve 58, open the gross fill valve 41 to admit DI water, open the main reservoir dispense valve 57, close the buffer reservoir inlet valve 97, open the main reservoir drain valve 99 so that the DI water passes from the main reservoir 69 bypassing the buffer reservoir 92. A similar sequence can be used with the buffer reservoir 71.

To clean and/or flush out the buffer reservoir 92, the DI water can pass through opened main reservoir dispense valve 57, opened buffer reservoir inlet valve 97, and closed main reservoir outlet valve 89. The buffer reservoir 71 can be cleaned and/or flushed by a similar arrangement as shown in FIG. 12.

In another embodiment, a fixed orifice pinch valve can be employed in cases where ultra-low flow rates are unattainable due to the properties of the mechanical components and the physical attributes of the mediums being dispensed. This pinch valve uses a flexible flow path that is compressed to a determined set point to create a fixed orifice. This will allow the desired restriction in the flow path necessary to increase or maintain a pressure for the "push" to control very low flow rates. The pinch valve can be actuated to open the flexible flow path to its maximum orifice to allow full flow during a flush sequence and then return to the desired determined set point. For example, a ¼-inch valve with a ¼-inch orifice controls the push pressure to the buffer reservoir to dispense the chemical. The output valve for the fluid is also ¼-inch. As the flow rate decreases the pressure required to push also decreases. In the case of ultra-low flow rate the inherent properties of the valves controlling the push pressure limit the repeatability of the precise volume of gas required to push. By installing the fixed orifice pinch valve and increasing the restriction on the dispense flow path, the push pressure can operate at higher levels resulting in precise repeatable control of ultra-low flow rates.

A PLC and/or operator can adjust the pinch valve's minimum and wide-open orifice size. The wide-open orifice setting can be used to clear obstructions in dispense lines. Turning the pinch valve wide-open is referred to as burping the line. This feature is important for CMP slurries because microbubbles form during low flow rates. The PLC can control the pinch valve so that pressure builds up to permit ultra-low flow rates and burped after a process cycle to clear any obstructions. The time period of the burp may be short such as 0.5 seconds and performed after delivery of the CMP slurry. A typical process only requires delivery of CMP slurry for up to 1.5 minutes and microbubbles may not appear in some CMP slurries for about 5 minutes so post-process burping may suffice. If not, the dispense lines can be burped more frequently without unduly affecting the flow rate over a given process cycle.

Figure 13:
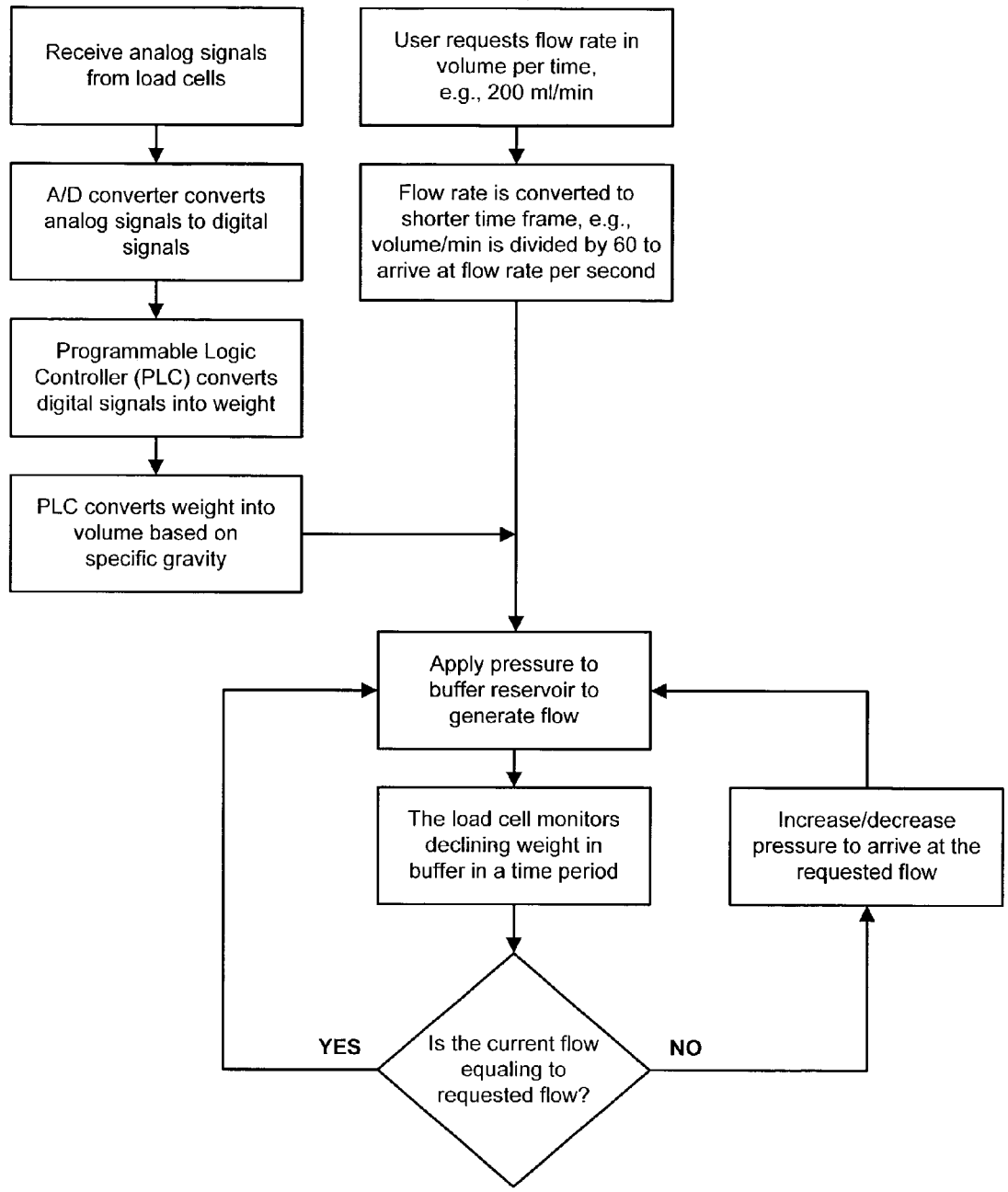
FIG. 13, a flow chart, illustrates a flow rate control system using the diminishing weight of liquid in at least one of the reservoirs.

FIG. 13 illustrates the functional blocks of the PLC that will be associated with one embodiment of the flow rate control system, which uses the diminishing weight of CMP slurry or other chemical mixture in at least one buffer reservoir. The load cells constantly monitor the weight of the CMP slurry and generate analog signals indicative of the weight of the CMP slurry in the buffer reservoir. An A/D converter converts those analog signals into digital format then sends them to the PLC. The PLC stores the specific gravity of each component to calculate component volumes. In parallel or serially with this activity, the user inputs through a keyboard, keypad, or touch screen a desired volumetric flow rate such as 200 ml/min. The PLC can convert the flow rate to rate per second. Next, the PLC directs that the buffer inlet pressure valves open to apply pressure to the buffer reservoir to produce the desired flow. The PLC monitors the declining weight in a time period and compares the current flow rate to the desired flow rate. If the flow rate is too low, the PLC sends signals to the proportional valve block to increase pressure, and if the flow rate is too high, the PLC sends signals to the proportional valve block to decrease the pressure. If the volumetric flow rate is within a predetermined tolerance, the PLC send signals to the proportional valve block that neither increase nor decrease the pressure to the buffer reservoir.

In other words, a "push" gas is supplied to the buffer reservoir by either a proportional control valve or valves and pressure is monitored via a pressure transducer or transmitter. The desired flow rate is entered, and a calculation is performed to determine the required weight loss from the reservoir during the course of a certain period of time. The PLC causes a signal to be sent to the proportional valve to adjust the push gas pressure, to adjust the weight loss within the reservoir to meet the flow rate requirements. The weight loss can be monitored over the course of time varying from 0.1 seconds to 60 seconds (or higher) depending on the accuracy of the flow rate required. For example, a flow rate of 180 milliliters per minute equals a flow rate of three milliliters per second. The PLC monitors the weight change within each buffer reservoir. If the weight loss is less than three milliliters per second, the pressure is increased. If the weight loss within the buffer reservoir is greater than three milliliters per second, the pressure is decreased. To achieve greater accuracy, the time frame can be shortened to the weight loss achieved during the course of 12 second, or even as low as 0.1 second or lower. The determining factor may be the resolution of the load cells associated with the buffer reservoir. If the load cell is able to resolve 0.1 gram, tighter controls can be implemented.

This embodiment requires no additional components to control flow. Since no additional devices are used, the problems of plugging are eliminated. Because the pressure to the reservoir is controlled by the PLC, varying input pressures are accounted for and proper adjustments are made to keep the flow at the desired rate. The PLC can be used to determine the average pressure utilized to maintain the proper flow rate. Once the level within the buffer reservoir reaches a point to where it needs to be refilled, the average pressure can be utilized to maintain the flow rate while the buffer reservoir is refilling.

The volume level is also monitored real time, which alleviates any requirement for additional components to detect level. The buffer reservoir will dispense chemical as required to satisfy a request command transmitted from the process tool. The volume level is replenished when a low volume set point is triggered as the declining weight is monitored. In like manner the volume being replenished is stopped when a high set point is triggered as the increase in weight is monitored.

The present invention provides at least the following benefits. The output chemical can be maintained at a constant pressure. A process tool never experiences a low-pressure chemical line that could prevent a dispense sequence from occurring; therefore the yield of the tool is increased. A multitude of containers and sizes can be connected to the reservoir system as chemical supply containers. If the fluid volume of the supply containers is known before they are connected, the computer can calculate very accurately the amount of chemical that has been removed from the container and therefore present the information to a display for a visual, real time indication of the remaining amount of chemical. The graphical interface communicates to the operator at a "glance" the condition of the supply containers. The load cells can determine when the supply container is completely empty since there will not be a continued weight increase during a refill sequence. This indicates the supply container is empty and that another container should be brought on line. In one embodiment, data logging of chemical usage can be provided since the chemical in the reservoir(s) is continuously and accurately weighed by load cell(s) which give an input signal to the PLC or other logic device which outputs real time, accurate information as to the amount of chemical available in the reservoir. The load cell is an inherently safe sensing device since failure is indicated by an abnormally large reading or an immediate zero reading, both of which cause the PLC or other logic device to trigger an alarm. The invention can also prevent bubbles that occur during a supply container switching operation from passing through to the output chemical line, can provide constant, non-varying pressure dispense with multiple supply containers, can refill itself by vacuum or by pumping liquid to refill the reservoir or refill with different chemicals at precise ratios and mix them before transferring the mixture to the buffer reservoir, which may be important for time dependent, very reactive chemistries.

The invention can provide precise flow control of fluids, chemistries, and compound mixtures utilizing pressure reservoirs fitted with valves, tubing, weight sensors (load cells), and a control system. The invention can also monitor and control volumetric level replenishment utilizing pressure reservoirs fitted with valves, tubing, weight sensors, and a control system. The invention can also replace the commonly used methodologies to control precise flow, such as manually set throttle valves and flow meters. The invention when fitted with the pinch valve can control very precise low flow rate.

What is claimed:
1. A chemical delivery system, comprising:
a main reservoir in fluid communication with one or more inlet fill valves, an inlet pressure valve, and a main reservoir outlet valve;

a buffer reservoir in fluid communication with a buffer reservoir inlet valve and a buffer outlet valve;

a line connecting the main reservoir outlet valve to the buffer reservoir inlet valve;

a load cell for monitoring the weight of a chemical in the buffer reservoir and generating analog signals that are converted to digital signals indicative of the weight of the chemical in the buffer reservoir;

a proportional valve block including a buffer control inlet valve and a buffer control outlet valve that adjusts the pressure to the buffer reservoir;

a programmable logic controller receiving the digital signals and generating control signals to the proportional valve block to achieve a desired chemical flow rate.

2. The system of claim 1, further comprising a load cell for monitoring the weight of the chemical in the main reservoir and generating analog signals that are converted to digital signals indicative of the weight of the chemical in the main reservoir.

3. The system of claim 2, wherein the one or more inlet fill valves includes a gross fill valve and a fine fill valve, and wherein the programmable logic controller sends a signal to open the gross fill valve until the main reservoir has almost sufficient chemical, and another signal to the chatter the fine fill valve until the main reservoir has the precise amount of chemical required.

4. The system of claim 2, wherein the programmable logic controller sends control signals to each of the one or more inlet fill valves sequentially so as to admit chemicals sequentially into the main reservoir so that the load cell of the main reservoir can weigh each chemical accurately.

5. The system of claim 4, further comprising a mixer assembly including a motor, and a shaft and an impeller associated with the main reservoir, wherein the programmable logic controller sends control signals to engage the motor, rotate the shaft and impeller which stirs the chemicals admitted into the main reservoir.

6. The system of claim 4, further comprising a mixer assembly including a motor, and a shaft and an impeller associated with the buffer reservoir, wherein the programmable logic controller sends control signals to engage the motor, rotate the shaft and impeller which continues to stir the mixture from the main reservoir that is admitted into the buffer reservoir.

7. The system of claim 1, further comprising a pinch valve in fluid communication and downstream of the buffer outlet valve, wherein the programmable logic controller sends control signals to the fully open the pinch valve to allow full flow during a flush sequence and then return to a more closed determined set point.

8. The system of claim 1, further comprising an inert gas supply that is in communication with the main reservoir and the buffer reservoir.

9. The system of claim 8, wherein the inert gas supply is passed through an inert gas humidifier so that the gas is humidified with the liquid in the inert gas humidifier.

10. The system of claim 8 or 9, wherein the chemical being delivered from the system is a chemical mechanical polishing formulation whose primary component is deionized water and the inert gas is nitrogen.

11. A method of liquid chemical delivery at low flow rates in a system comprising a multi-reservoir load cell assembly, including a main reservoir, a buffer reservoir, each reservoir having at least one load cell and a mixer, and a logic device, comprising:

isolating the main reservoir from the buffer reservoir;

reducing pressure in the main reservoir;

adding liquid chemical components sequentially into the main reservoir;

weighing each liquid chemical component by the multi-reservoir load cell assembly;

mixing the chemical components into a mixture;

supplying the main reservoir with an inert gas;

transporting mixture from the main reservoir to the buffer reservoir; and transporting the mixture from the buffer reservoir through a pinch valve.

* * * * *